(12) United States Patent
Luo et al.

(10) Patent No.: US 9,800,014 B2
(45) Date of Patent: *Oct. 24, 2017

(54) LIGHT EMISSION MODULE

(71) Applicant: Global Technology Inc., Ningbo (CN)

(72) Inventors: Jian-Hong Luo, Ningbo (CN);
Chao-Hung Tsai, New Taipei (TW);
Qiu-ning Zhao, Ningbo (CN); Hua Liu, Ningbo (CN)

(73) Assignee: Global Technology Inc., Ningbo (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/077,368

(22) Filed: Mar. 22, 2016

(65) Prior Publication Data

US 2017/0093120 A1    Mar. 30, 2017

(30) Foreign Application Priority Data

Sep. 30, 2015  (CN) .................... 2015 2 0769723 U

(51) Int. Cl.
*H01S 5/00* (2006.01)
*H01S 5/0683* (2006.01)
*H01S 5/022* (2006.01)

(52) U.S. Cl.
CPC .......... *H01S 5/0014* (2013.01); *H01S 5/0071* (2013.01); *H01S 5/0683* (2013.01); *H01S 5/0064* (2013.01); *H01S 5/02248* (2013.01); *H01S 5/02284* (2013.01)

(58) Field of Classification Search
CPC .... H01S 5/0262; H01S 5/0264; H01S 5/0261; H01S 5/0014; H01S 5/0638–5/0687
See application file for complete search history.

(56) References Cited

U.S. PATENT DOCUMENTS

| 4,470,143 A * | 9/1984 | Kitamura | H01S 5/0264 257/E33.076 |
| 4,750,799 A * | 6/1988 | Kawachi | G02B 6/12004 385/14 |
| 5,032,879 A * | 7/1991 | Buchmann | H01S 5/0264 257/432 |
| 5,438,208 A * | 8/1995 | Takemoto | H01S 5/0264 250/551 |

(Continued)

FOREIGN PATENT DOCUMENTS

JP    2004273782 A    9/2004

OTHER PUBLICATIONS

US Office Action mailed Sep. 30, 2016, received in U.S. Appl. No. 15/077,426, 9 pgs.

*Primary Examiner* — Joshua King
(74) *Attorney, Agent, or Firm* — Grossman Tucker Perreault & Pfleger, PLLC; Norman S. Kinsella

(57) ABSTRACT

A light emission module includes a base, a laser diode driver, a laser diode, a monitor photodiode and a reflecting mirror. The laser diode driver, the laser diode and the monitor photodiode are disposed on the base. The monitor photodiode and the laser diode are located close to a front end of the laser diode driver. A rear side of the laser diode faces the laser diode driver. The reflecting mirror is disposed between the rear side of the laser diode and the monitor photodiode for reflecting a light emitted from the rear side of the laser diode to a light receiving surface of the monitor photodiode.

4 Claims, 1 Drawing Sheet

(56) References Cited

U.S. PATENT DOCUMENTS

| | | | |
|---|---|---|---|
| 5,668,823 A * | 9/1997 | Harrison | H01S 5/02252 372/19 |
| 6,374,021 B1 * | 4/2002 | Nakanishi | G02B 6/4246 385/49 |
| 6,567,590 B1 * | 5/2003 | Okada | H01S 5/02252 385/14 |
| 7,013,056 B2 * | 3/2006 | Lin | G02B 6/29362 385/14 |
| 7,106,980 B2 * | 9/2006 | Nakanishi | G02B 6/12007 257/E31.117 |
| 2002/0057876 A1 * | 5/2002 | Yamabayashi | G02B 6/4201 385/88 |
| 2003/0102496 A1 * | 6/2003 | Kuhara | G02B 6/4202 257/233 |
| 2004/0222439 A1 * | 11/2004 | Musk | H01S 5/0683 257/202 |
| 2005/0068996 A1 * | 3/2005 | Narayan | H01S 5/141 372/20 |
| 2009/0269067 A1 * | 10/2009 | Kihara | H01S 5/02212 398/79 |

\* cited by examiner

LIGHT EMISSION MODULE

CROSS-REFERENCE TO RELATED APPLICATIONS

This non-provisional application claims priority under 35 U.S.C. §119(a) on Patent Application No(s). 201520769723.8 filed in China on Sep. 30, 2015, the entire contents of which are hereby incorporated by reference.

TECHNICAL FIELD

The disclosure relates to the fiber-optic communication, more particularly to a light emission module.

BACKGROUND

In a high speed optical transmission system, a light emission module in a light transceiver plays an important role, especially a high-speed laser diode module with a speed higher than 25 Gbps. In this light emission module, a length of a connecting line between a laser diode and a laser diode driver seriously affects the quality of the signal transmission. Therefore, the shorter a distance between the laser diode and the laser diode driver is, the better the quality of the signal transmission is. In order to monitor the operation of the laser diode, which emits the laser from the front side and leaks a light from the rear side, a monitor photodiode is disposed at the rear side of the laser diode. The monitor photodiode detects the light leaked from the rear side of the laser diode so as to monitor the operation of the laser diode.

In the conventional light emission module, the monitor photodiode is disposed right behind the rear side of the laser diode for detecting the light leaked from the rear side of the laser diode. In order to prevent the light incident on a light receiving surface of the monitor photodiode from reflecting back to the laser diode, the light receiving surface of the monitor photodiode is tilted relative to an emission axis of the laser diode. In high-speed laser diode module, the laser diode and the laser diode driver are requested to be assembled in one module. In order to the distance between the laser diode and the laser diode driver, the laser diode driver is disposed at a lateral side of the laser diode which is between the front side and the rear side of the laser diode. However, the aforementioned arrangement provides an overly large width of the light emission module so that a size of the light transceiver is increased together with the width of the light emission module.

SUMMARY

The disclosure relates to a light emission module, which has minimized size, kept the function of the monitor photodiode and minimized the distance between the laser diode and the laser diode driver.

According to one embodiment of the present disclosure, a light emission module includes a base, a laser diode driver, a laser diode, a monitor photodiode and a reflecting mirror. The laser diode driver, the laser diode and the monitor photodiode are disposed on the base. The monitor photodiode and the laser diode are located close to a front end of the laser diode driver. A rear side of the laser diode faces the laser diode driver. The reflecting mirror is disposed between the rear side of the laser diode and the monitor photodiode for reflecting a light emitted from the rear side of the laser diode to a light receiving surface of the monitor photodiode.

According to the light emission module in the embodiment of the disclosure, a little light emitted from the rear side irradiates at the light receiving surface of the monitor photodiode by reflection of the reflecting mirror; therefore, the monitor photodiode can monitor the operation of the laser diode. Moreover, the monitor photodiode and the laser diode can be disposed in front of the front end of the laser diode driver but a side of the laser diode driver so that the width of the base is greatly minimized. In addition, the monitor photodiode has no need to be disposed behind the rear side of the laser diode, and only a reflecting mirror is disposed between the laser diode and the laser diode driver; as a result, the distance between the laser diode and the laser diode driver can be very short.

According to the light emission module in the embodiment of the disclosure, the light emitted from the rear side of the laser diode is reflected by the reflecting mirror with an incident angle from 20 degrees to 60 degrees. The distribution of the reflecting mirror, the laser diode and the monitor photodiode satisfies the above condition so that the light emitted from the rear side of the laser diode can be incident on the light receiving surface of the monitor photodiode by the reflection of the reflecting mirror. Moreover, the distribution of the reflecting mirror, the laser diode and the monitor photodiode satisfying the above condition also minimizes the distance between the distribution of the reflecting mirror, the laser diode and the monitor photodiode. Therefore, a spaced occupied by the reflecting mirror, the laser diode and the monitor photodiode on the base is minimized.

According to the light emission module in the embodiment of the disclosure, the light emitted from the rear side of the laser diode is reflected by the reflecting mirror with an incident angle from 30 degrees to 45 degrees. The light emission module of the disclosure satisfying the above condition is more preferable.

According to the light emission module in the embodiment of the disclosure, the monitor photodiode is tilted for reflecting the light incident on the light receiving surface of the monitor photodiode from the reflecting mirror to the side of the laser diode. This structure prevents the light incident on the light receiving surface of the monitor photodiode being reflected and entering the laser diode. Specifically, the interference between the light reflected by the reflecting mirror and the laser emitted by the laser diode can be prevented.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
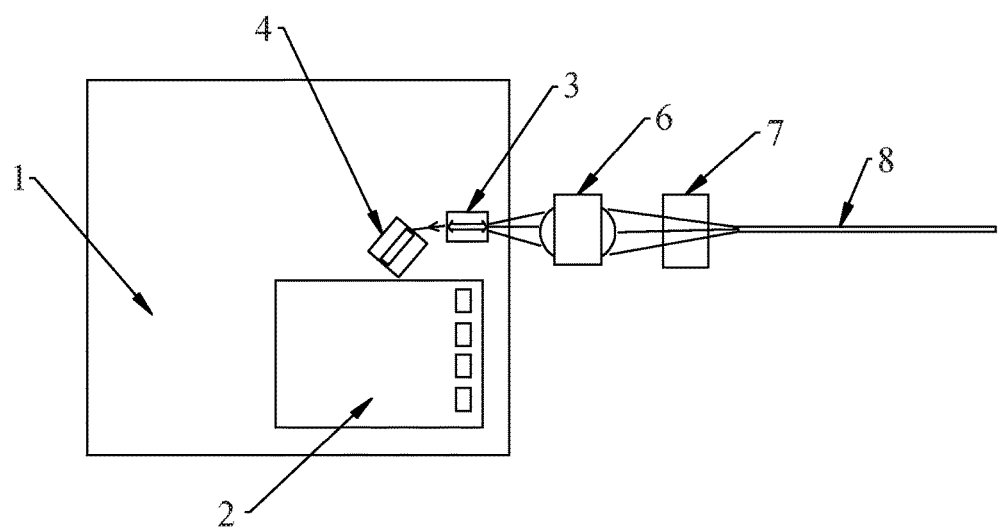
FIG. 1 is a schematic view of a conventional light emission module.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is a schematic view of a conventional light emission module. The conventional light emission module may include a laser diode driver 2, a laser diode 3 and a monitor photodiode 4 which are disposed on a base 1. The monitor photodiode 4 is located right behind the laser diode 3. In order to prevent a light incident on a light receiving surface of the monitor photodiode 4 from being reflected back to the laser diode 3, a specific angle between the light receiving surface of the monitor photodiode 4 and a emission axis of the laser diode 3 is preferred. For reducing a distance between the laser diode 3 and the laser diode driver 2, the laser diode 3 and the monitor photodiode 4 are located at a lateral side of the laser diode driver 2 so that the laser diode 3 is close enough to the rear side of the laser diode driver 2. However, the above structure occupies a great space on the base 1 so that a width of the base 1 is overly large, thereby increasing the total volume of the light emission module.

Figure 2:
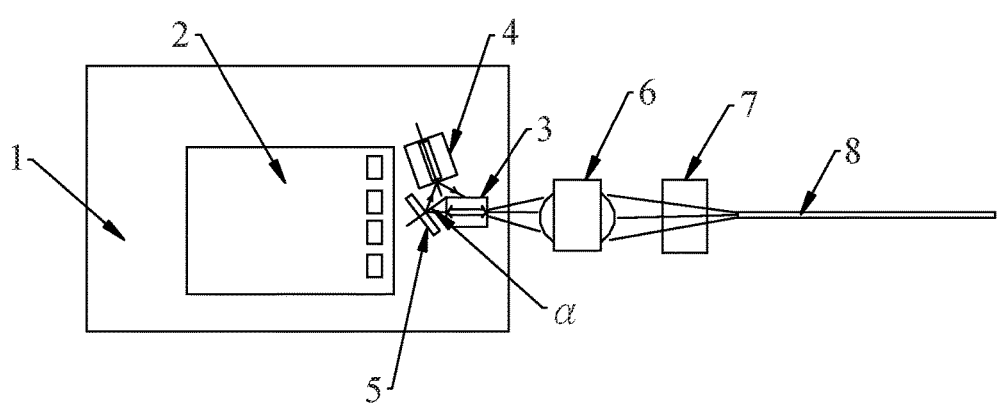
FIG. 2 is a schematic view of a light emission module according to an embodiment of the present disclosure.

Please refer to FIG. 2. FIG. 2 is a schematic view of a light emission module according to an embodiment of the present disclosure. The light emission module in this embodiment of the disclosure includes a base 1, a laser diode driver 2, a laser diode 3, a monitor photodiode 4 and a reflecting mirror 5. The laser diode driver 2, the laser diode 3 and the monitor photodiode 4 are disposed on the base 1. The laser diode driver 2 has a front end and a rear end that are opposite to each other. The laser diode 3 has a front side, a rear side and two lateral sides, wherein the front side and the rear side are opposite to each other, and the two lateral sides are located between the front side and the rear side. The front end of the laser diode driver 2 is closer to the rear side of the laser diode 3 than the rear end. The front side of the laser diode 3 may be closer to an optical fiber 8 than the rear side.

The monitor photodiode 4 and the laser diode 3 are located close to the front end of the laser diode driver 2. A rear side of the laser diode 3 faces the laser diode driver 2. The reflecting mirror 5 is disposed between the rear side of the laser diode 3 and the monitor photodiode 4 for reflecting a light emitted from the rear side of the laser diode 3 to a light receiving surface of the monitor photodiode 4. The front end of the laser diode driver 2 is used for connecting the laser diode driver 2 and the laser diode 3.

The laser diode driver 2 may drive the laser diode 3 to emit a laser. The laser is emitted from the front side of the laser diode 3 and passes through a lens 6 and an isolation device 7 so as to travel into the optical fiber 8. When the laser is emitted from the front side of the laser diode 3, the rear side of the laser diode 3 also emits a few amount of light. The light emitted from the rear side of the laser diode 3 is detected by the monitor photodiode 4 for monitoring the operation of the laser diode 3.

According to the structure of the light emission module described above, the light emitted from the rear side is reflected by the reflecting mirror 5 so as to be incident on the light receiving surface of the monitor photodiode 4; therefore, the monitor photodiode 4 is able to monitor the operation of the laser diode 3. Moreover, the monitor photodiode 4 and the laser diode 3 can be disposed near or at the front end of the laser diode driver 2 but the lateral side of the laser diode driver 2 so that the width of the base 1 is reduced. In addition, the monitor photodiode 4 has no need to be disposed behind the rear side of the laser diode 3, and only the reflecting mirror 5 is disposed between the laser diode 3 and the laser diode driver 2; as a result, the distance between the laser diode 3 and the laser diode driver 2 can be reduced so as to obtain compactness.

In this embodiment, the light emitted from the rear side of the laser diode 3 may be reflected by the reflecting mirror 5 with an incident angle α at a range from 20 degrees to 60 degrees. The arrangement of the reflecting mirror 5, the laser diode 3 and the monitor photodiode 4 may satisfies the above condition so that the light emitted from the rear side of the laser diode 3 can be incident on the light receiving surface of the monitor photodiode 4 by the reflection of the reflecting mirror 5. Moreover, the arrangement of the reflecting mirror 5, the laser diode and the monitor photodiode 4 satisfying the above condition further reduces the distances between each other. Therefore, a space occupied by the reflecting mirror 5, the laser diode 3 and the monitor photodiode 4 on the base 1 is reduced.

In this embodiment, the light emitted from the rear side of the laser diode 3 can be reflected by the reflecting mirror with the incident angle α at a range from 30 degrees to 45 degrees. The light emission module of the disclosure satisfying the above condition can be more preferable for minimizing the distances between every two elements in the light emission module.

In this embodiment, the monitor photodiode 4 may be tilted for reflecting the light incident on the reflecting mirror 5. In detail, the light receiving surface of the monitor photodiode 4 is used for reflecting the light incident from the reflecting mirror 5 to the lateral side of the laser diode 3. This arrangement prevents the light incident on the light reflecting surface from being reflected by the light receiving surface to the laser diode 3. Specifically, the interference between the light reflected by the reflecting mirror 5 and the laser emitted by the laser diode 3 can be prevented. The monitor photodiode 4 is tilted means that a specific angle may be between the light receiving surface of the monitor photodiode 4 and the reflecting mirror 5; therefore, the light incident on the light receiving surface of the monitor photodiode 4 by the reflection of the reflecting mirror 5 is reflected again by the light receiving surface of the monitor photodiode 4, and the light reflected by the light receiving surface of the monitor photodiode 4 is incident on the lateral side of the laser diode 3 but enter into the laser diode 3.

What is claimed is:

1. A light emission module comprising a laser diode driver, a laser diode, a monitor photodiode, and a reflecting mirror, each being coupled to a base, the laser diode having a front side and a rear side, the rear side being opposite the front side, the front side being optically coupled to an optical fiber such that at least a portion of the laser light generated by the laser diode is emitted from the front side of the laser diode and into the optical fiber, the reflecting mirror being positioned between the rear side of the laser diode and the laser diode driver, at least a portion of the light generated by the laser diode being emitted from the rear surface of the laser diode and being incident on the reflecting mirror, the light incident on the reflecting mirror being reflected to a light receiving surface of the monitor photodiode, wherein at least a portion of the light incident on the light receiving surface of the monitor photodiode is reflected, the light reflected from the light receiving surface of the monitor photodiode being incident on a lateral side of the laser diode, the lateral side of the laser diode extending between the front and rear sides of the laser diode.

2. The light emission module of claim 1, wherein the light emitted from the rear side of the laser diode is reflected by the reflecting mirror with an incident angle from 20 degrees to 60 degrees.

3. The light emission module of claim 2, wherein the light emitted from the rear side of the laser diode is reflected by the reflecting mirror with an incident angle from 30 degrees to 45 degrees.

4. The light emission module of claim 1, wherein the monitor photodiode is tilted.

* * * * *